US008024645B2

(12) United States Patent  
Feeney et al.

(10) Patent No.: US 8,024,645 B2
(45) Date of Patent: Sep. 20, 2011

(54) METHOD FOR ERROR DETECTION IN A DECODED DIGITAL SIGNAL STREAM

(75) Inventors: Gregory A. Feeney, Palatine, IL (US); Kevin G. Doberstein, Elmhurst, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 1015 days.

(21) Appl. No.: 11/427,612

(22) Filed: Jun. 29, 2006

(65) Prior Publication Data

US 2008/0005649 A1    Jan. 3, 2008

(51) Int. Cl.
*H03M 13/00*    (2006.01)
(52) U.S. Cl. ........................................................ 714/785
(58) Field of Classification Search .................. 714/785, 714/755
See application file for complete search history.

(56) References Cited

U.S. PATENT DOCUMENTS

| | | | | |
|---|---|---|---|---|
| 5,412,741 | A * | 5/1995 | Shapiro .......................... | 382/232 |
| 5,563,897 | A | 10/1996 | Pyndiah | |
| 5,930,273 | A * | 7/1999 | Mukojima ..................... | 714/776 |
| 6,763,494 | B2 * | 7/2004 | Hewitt ........................... | 714/780 |
| 7,310,767 | B2 * | 12/2007 | Desai et al. ................... | 714/782 |
| 2002/0049947 | A1 * | 4/2002 | Sridharan et al. ............. | 714/752 |
| 2004/0095907 | A1 | 5/2004 | Agee | |
| 2005/0084033 | A1 | 4/2005 | Rosen | |
| 2006/0136967 | A1 | 6/2006 | Hellman | |
| 2008/0104479 | A1 * | 5/2008 | Lablans ......................... | 714/757 |

OTHER PUBLICATIONS

Norman Abramson "Cascade Decoding of Cyclic Product Codes", IEEE Trans on Comm Technology, vol. COM-16, No. 3, 1968, XP002535387.
Hank Wallace "Error Detection and Correction Using the BSH Code", Internet Article, 2001, XP002536883, URL: http://www.aqdi.com/bch.pdf>.
European Search Report Dated Jul. 14, 2009.
PCT International Search Report Dated Feb. 14, 2008.
PCT International Preliminary Report on Patentability Dated Jan. 5, 2009.
EPC Communication Dated Dec. 28, 2009.

* cited by examiner

*Primary Examiner* — Scott Baderman
*Assistant Examiner* — Enam Ahmed
(74) *Attorney, Agent, or Firm* — Indira Saladi; Valerie M. Davis

(57) ABSTRACT

The present invention relates to a method for analyzing a decoded digital signal stream. The method comprises decoding an encoded digital signal stream to obtain a decoded digital stream and terminating the decoding operation in an N dimension, wherein N is an integer greater than one. The method further comprises calculating one or more syndromes in a dimension not comprising the N dimension of the decoded digital signal stream. At least one invalid syndrome is then detected from the one or more calculated syndromes. In one embodiment, an error is reported in the decoded digital stream based upon detecting at least one invalid syndrome.

20 Claims, 3 Drawing Sheets

METHOD FOR ERROR DETECTION IN A DECODED DIGITAL SIGNAL STREAM

FIELD OF INVENTION

The present invention relates generally to error detection. More specifically, the present invention relates to a method for error detection in a decoded digital signal stream.

BACKGROUND OF THE INVENTION

In order to improve bandwidth usage, it is necessary to minimize the amount of bits allotted for system usage. For instance, the existing public safety systems require improved bandwidth usage. This can be done by migrating the current 25 kHz systems and the 12.5 kHz systems to 6.25 kHz systems with equivalent bandwidths. It is therefore extremely desirable to make as efficient use of possible existing codes and parity checks for improving system performance. Some of the existing codes and parity checks are Simple Parity Check (SPC), hamming code, extended hamming code, a Bose-Chaudhari-Hocquenghem (BCH) code and or an extended BCH code.

Moreover, various Block Product Codes (BPC) are used to provide forward error correction for various Layer 2 signaling fields. However, the BPC is used only to correct errors. No attempts are made to detect any errors from the turbo decoding, other than any checksum or Cyclic redundancy Check (CRC) parity included with the information bits.

Therefore, there is a need for a method for increasing an accuracy of error detection while incurring no additional overheads in terms of additional bit usage.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE INVENTION

Figure 1:
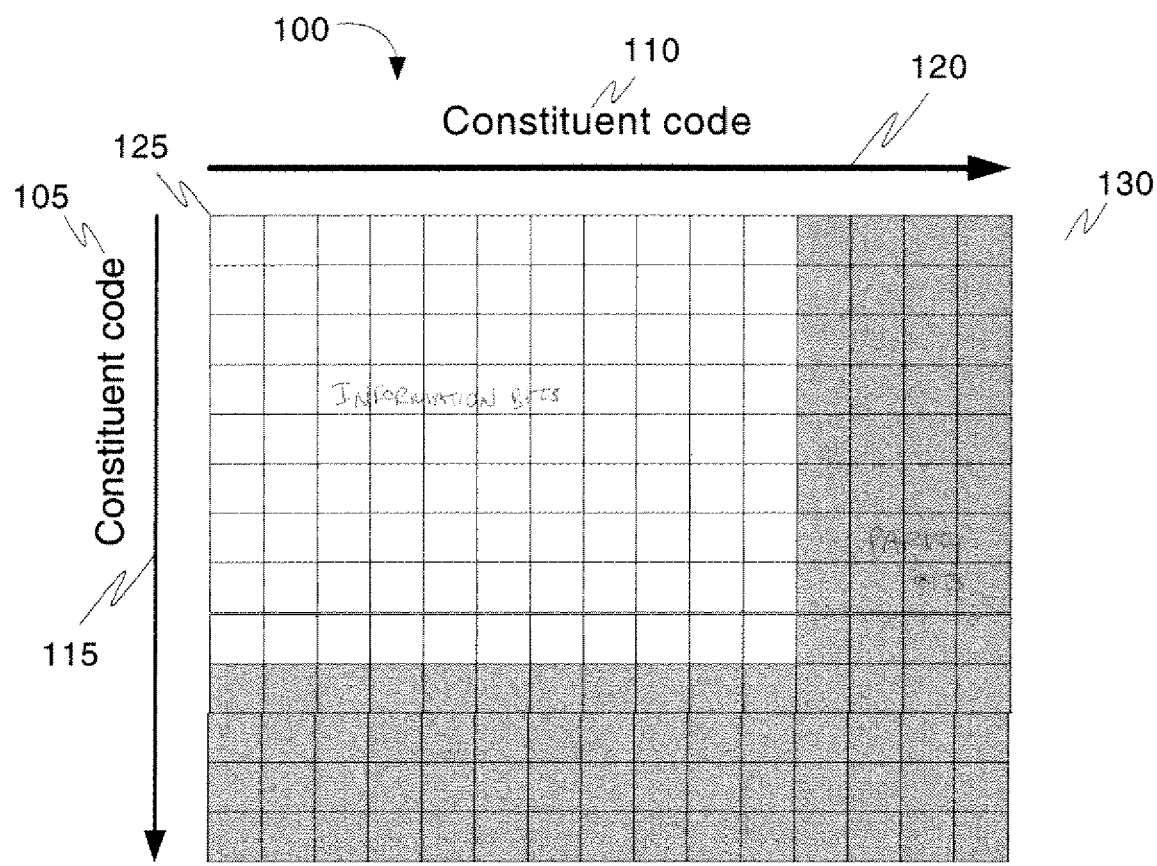
FIG. 1 illustrates a diagram depicting an encoded digital signal stream encoded using a block product code (BPC) in accordance with an embodiment of the present invention.

Before describing in detail, embodiments that are in accordance with the present invention, it should be observed that the embodiments reside primarily in combinations of method steps related to a method for analyzing a decoded digital signal stream to detect errors in the decoded digital signal stream. Accordingly, the method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

In this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art.

It will be appreciated that embodiments of the present invention described herein may be comprised of one or more conventional processors and unique stored program instructions that control the one or more processors to implement, in conjunction with certain non-processor circuits, some, most, or all of the functions of a method for analyzing a decoded digital signal stream to detect errors in the decoded digital signal stream. The non-processor circuits may include, but are not limited to, a radio receiver, a radio transmitter, signal drivers, clock circuits, power source circuits, and user input devices. As such, these functions may be interpreted as steps of a method for analyzing a decoded digital signal stream to detect errors in the decoded digital signal stream in a defined environment described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, pursuant to the various embodiments, the present invention provides a method for analyzing a decoded digital signal stream to detect errors in the decoded digital signal stream. Many applications require a digital signal stream comprising information bits to be transmitted from one device to another. While transmitting the digital signal stream, the information bits in the digital signal stream can get corrupted. To enable a device to detect corruption of the digital signal stream, the digital signal stream is encoded to obtain an encoded digital signal stream. This encoded digital signal stream is transmitted instead of transmitting the digital signal stream. A device which receives the encoded digital signal stream, decodes the encoded digital signal stream to obtain the decoded digital signal stream. However, those skilled in the art will realize that the decoded digital signal stream may not always be completely error free. Therefore, correct information bits may not be acquired from the decoded digital signal stream. Various embodiments of the present invention provide a method to analyze the decoded digital signal stream so as to detect any errors in decoded digital signal stream. Those skilled in the art will realize that the above recognized advantages and other advantages described herein are merely exemplary and are not meant to be a complete rendering of all of the advantages of the various embodiments of the present invention.

Referring now to FIG. 1, a diagram depicting an encoded digital signal stream 100 encoded using a block product code (BPC) is shown in accordance with an embodiment of the present invention. A BPC is a set of linear constituent codes that can be arranged in a multi-dimensional structure. The BPC code is specified by its constituent codes, geometric arrangements of the constituent codes used, and the number of constituent codes used. In the present diagram, the BPC used for encoding the encoded digital signal stream 100 (comprising information bits 125 and parity bits 130) is a set of two constituent codes that are arranged in a two-dimensional structure. Those skilled in the art, however, will recognize and appreciate that the specifics of this illustrative example are not specifics of the present invention itself and that the teachings set forth herein are applicable in a variety of alternative settings. For example, since the teachings described do not depend on the number of dimensions of the BPC or the type of constituent codes used, the teachings can be applied to any number of dimensions and any type of constituent codes although the BPC with two constituent codes and two dimensions is shown in this embodiment. As such, other alternative implementations of using different types of constituent codes and any number of dimensions are contemplated and are within the scope of the various teachings described.

The two constituent codes are herein referred to as a constituent code 105 and a constituent code 110. In one embodiment, the constituent code 105 and the constituent code 110 can be block codes. The constituent code 105 and the constituent code 110 can be, for example, a Simple Parity Check (SPC), Hamming code, extended hamming code, a Bose-Chaudhari-Hocquenghem (BCH) code, or an extended BCH code. Those skilled in the art will realize that the constituent code 105 and the constituent code 110 can be the same constituent codes or can be different constituent codes. The constituent code 105 is applied in a dimension 115, whereas the constituent code 110 is applied in a dimension 120. The encoded digital signal stream comprises information bits 125 and parity bits 130. In dimension 115, there are 13 bits in each column comprising 9 information bits and 4 parity bits. Whereas in the dimension 120, there are 15 bits in each column comprising 11 information bits and 4 parity bits. Thus, it will be appreciated by those skilled in the art that the encoded digital signal stream 100 comprises 99 information bits and 96 parity bits. In the BPC, the 99 information bits are organized as an 11 column by 9 row matrix. The first 11 columns of 9 bits each are encoded with the constituent code 105 and the resulting 13 rows of 11 bits each are then encoded using the constituent code 110.

A decoding operation is performed on this encoded digital signal stream to obtain a decoded digital signal stream. The decoding operation is usually done iteratively. Starting with a chosen constituent code in a given dimension, a plurality of codewords of the chosen constituent code are decoded first in the starting dimension and then the remaining constituent code is decoded across the plurality of codewords in the remaining dimension. Some of the decoding parameters are updated based on this iteration and then the decoding operation is repeated for a set number of iterations.

For example if the constituent code 105 is a Hamming (13,9) code and the constituent code 110 is a Hamming (15, 11) code, then the iterations may start in the dimension 115 corresponding to the constituent code 105. The iterations conventionally terminate in the dimension 120. Note that it is also valid to start with constituent code 110 and end with constituent code 105. After the termination of the decoding operation, the decoded digital signal stream is analyzed to detect errors in the decoded digital signal stream. A method of analyzing the decoded digital signal stream is described in detail in FIG. 2.

Figure 2:
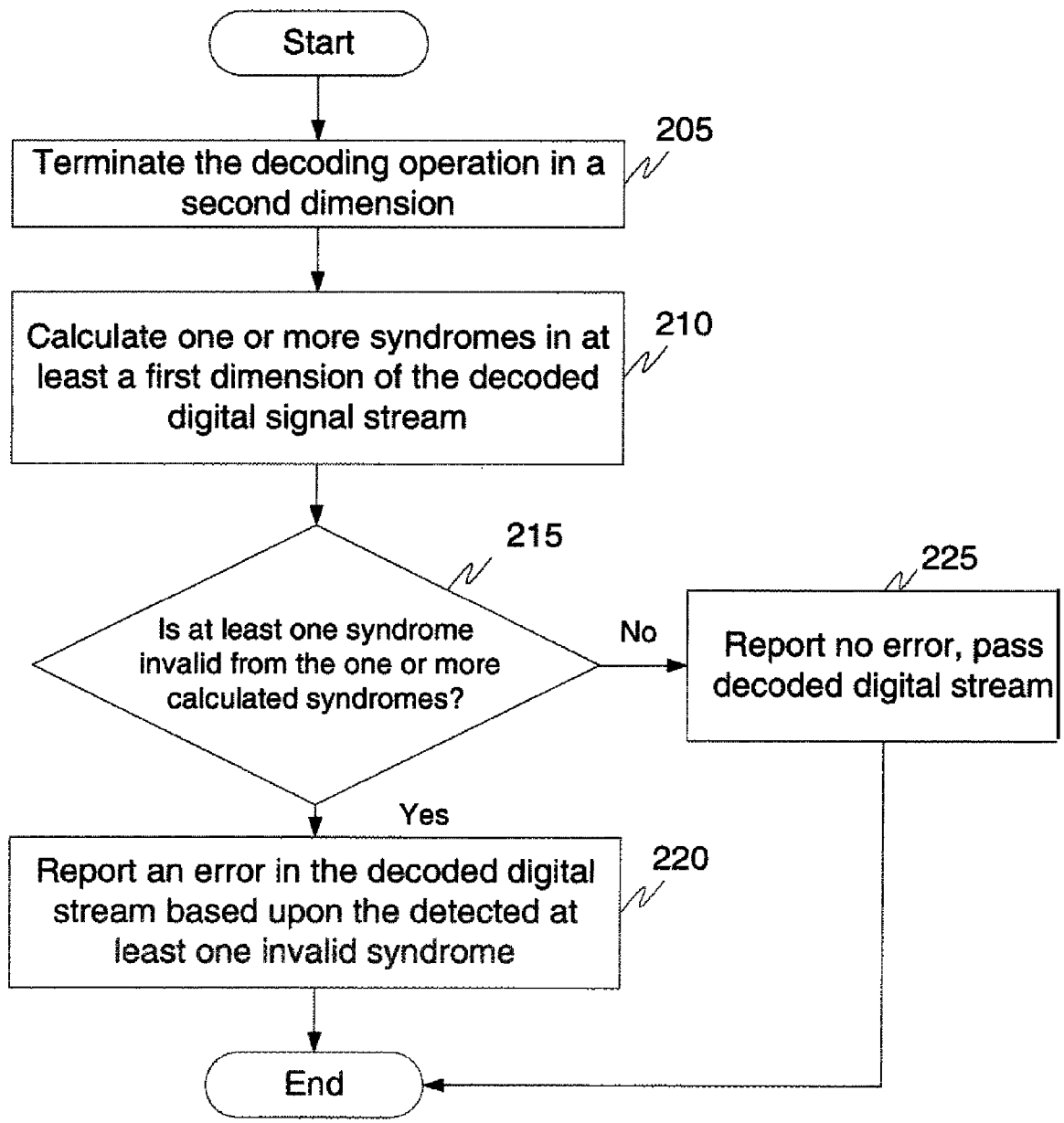
FIG. 2 illustrates a flow diagram of a method of analyzing a decoded digital signal stream in conjunction with FIG. 1 in accordance with an embodiment of the present invention.

Turning now to FIG. 2, a flow diagram of a method of analyzing a decoded digital signal stream in conjunction with FIG. 1 is shown in accordance with an embodiment of the present invention. The encoded digital signal stream 100 is decoded by performing a decoding operation on the encoded digital signal stream 100 iteratively. In an embodiment of the present invention, the decoding operation is initiated on a first constituent code. The constituent code 105 can be a Hamming (13,9) and the constituent code 110 can be a Hamming (15, 11) code. The decoding operation can be initiated in the dimension 115. Upon decoding the encoded digital signal stream iteratively, the decoding operation is terminated in the dimension 120 at step 205. At step 210, one or more syndromes are calculated in the dimension 115 of the decoded digital signal stream, where a syndrome is a distinctive or characteristic pattern, as is well known in the art.

Step 210 for calculating the one or more syndromes can comprise performing an action on a plurality of bits in the dimension 115, such that an error in the decoded digital signal stream can be detected. The syndrome calculation is a process well known in the art, wherein syndrome value S can be computed via the matrix operation $S=rH^T$, where r is the vector containing the received codeword bits and $H^T$ is the parity check matrix for the constituent code. Those skilled in the art will realize that the syndrome value will determine if there are detectable errors present or not. For instance, in the present embodiment where the constituent code 105 is a Hamming (13,9), the 13 bits in each column in the dimension 115 can be used to compute a syndrome. Thus 15 syndromes corresponding to the 15 columns can be obtained. If a syndrome has a zero value, it indicates that no errors were detected in the codeword. Any non-zero value of the syndrome indicates that at least one error was detected in the codeword.

At step 215, one or more invalid syndromes from the one or more calculated syndromes are detected. The invalid syndrome indicates one or more bit errors in the dimension 115. As mentioned earlier, a syndrome can be invalid if the syndrome had a non-zero value. This implies that if the syndrome corresponding to that column has a zero value, the syndrome is valid and no error is detected in the 13 bits in the column.

If one or more invalid syndromes are detected at step 215, an error in the decoded digital stream is reported at step 220. If no invalid syndromes are detected at step 215, then no errors are reported in step 225 and the decoded digital stream is passed to a higher layer for further processing. Otherwise, if a valid syndrome is detected at step 215, then no errors are reported in step 225 and the decoded digital stream is passed to a higher layer for further processing. An embodiment of the present invention increases an accuracy of detecting errors in an already decoded digital signal stream without any additional overheads. That is, the error detection accuracy may increase without requiring additional bits above what is already being used in the encoded digital signal stream.

The embodiment of FIG. 2 analyzes a two-dimensional decoded digital signal for narrowband protocols. However, those skilled in the art will realize that the method of FIG. 2 can easily be extended to higher dimension coded and other protocols of wider or narrower bandwidths.

Figure 3:
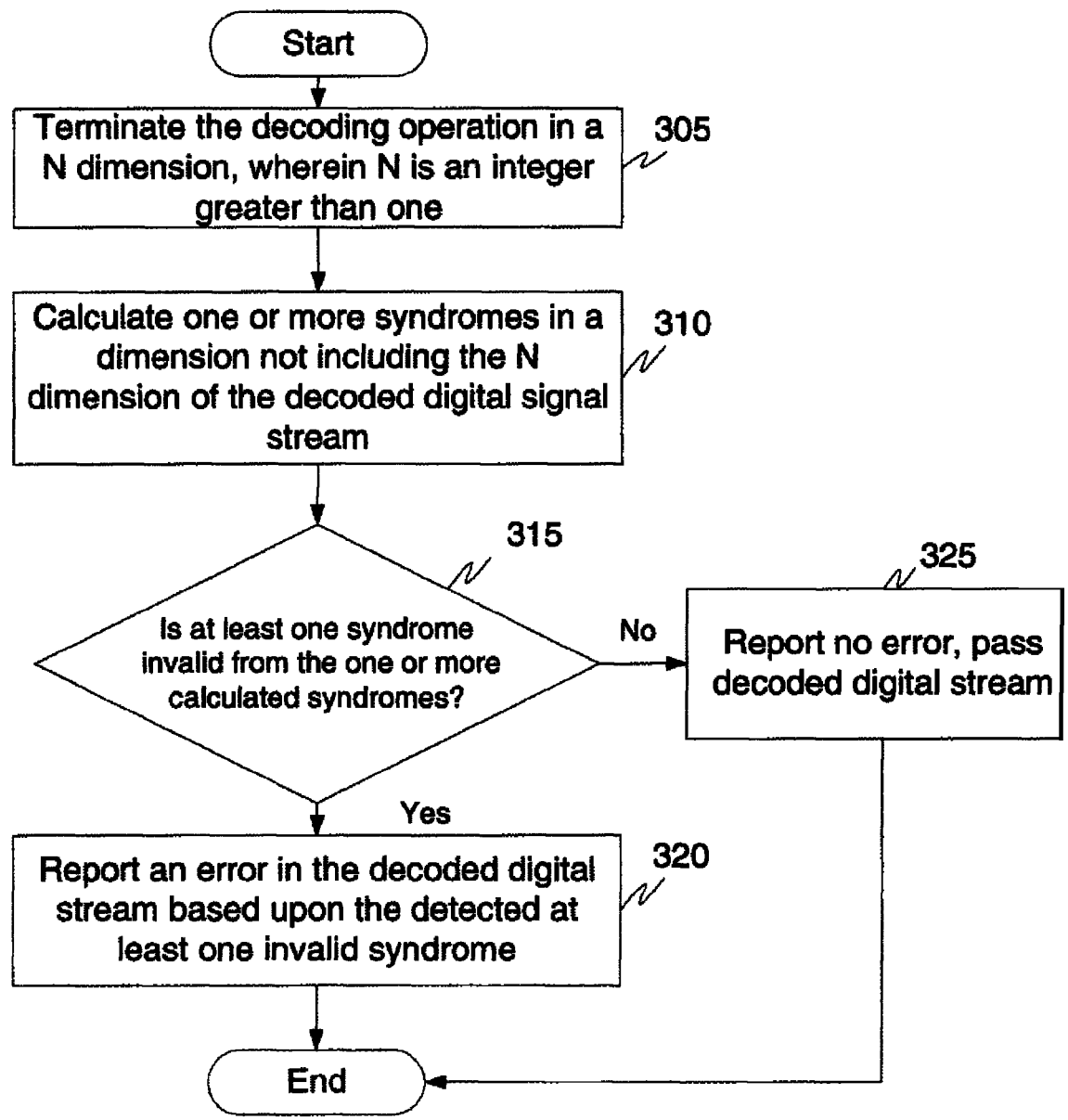
FIG. 3 illustrates a flow diagram of a method of analyzing a decoded digital signal stream with N dimensions in accordance with an embodiment of the present invention.

Turning now to FIG. 3, a flow diagram of a method of analyzing a decoded digital signal stream with N dimensions is shown in accordance with an embodiment of the present invention. A digital signal stream can be encoded using a BPC. N constituent codes can be used to encode the digital signal stream to obtain an encoded digital signal stream. The encoded digital signal stream will, thus, be encoded in N dimensions. The encoded digital signal stream comprises at least one information bit and at least one parity bit. A decoding operation is performed on an encoded digital signal stream iteratively to obtain the accurate information bits, as elaborated in the description of FIG. 1. The decoding operation is terminated in N dimension at step 305. Those skilled in the art will realize that N is an integer greater than one. Upon terminating the decoding operation, the decoded digital signal stream is obtained. However, the decoded digital signal stream may not always be error free. To detect any errors in the decoded digital signal stream, one or more syndromes are calculated in a dimension not including the N dimension of the decoded digital signal stream, at step 310. The one or more syndromes can, specifically, be calculated in an N–1 dimension. The N–1 dimension is a dimension in which the decoding operation is performed prior to the decoding action being performed in the N dimension during the decoding iterations. In an embodiment of the present invention, one or more syndromes can be calculated in other dimensions also, including calculating the one or more syndromes in the N dimension. For example, referring back to FIG. 2, if the decoding operation is terminated in the dimension 120, the one or more syndromes are calculated in the dimension 115. Calculating the one or more syndromes at step 310 can comprise performing an action on a plurality of bits in a dimension. For instance, in the embodiment of FIG. 2, the action being performed is computing a syndrome in the dimension 115.

At step 315, one or more invalid syndromes from the one or more calculated syndromes are detected. The invalid syndrome indicates one or more bit errors in the corresponding dimension. In an embodiment of the present invention, the syndrome is invalid if the syndrome has a non-zero value, whereas the syndrome is valid if the syndrome has a zero value. Those skilled in the art will appreciate that syndromes can be calculated and invalid syndromes can be detected in a similar manner in other embodiments of the present invention involving other constituent codes. The constituent codes can be, for example, a SPC code, a hamming code, an extended hamming code, a Bose-Chaudhari-Hocquenghem (BCH) code, or an extended BCH code.

If one or more invalid syndromes are detected at step 315, an error in the decoded digital stream is reported at step 320. If no invalid syndromes are detected at step 315, then no errors are reported in step 325 and the decoded digital stream is passed from the process. This increases an accuracy of detecting errors in an already decoded digital signal stream without incurring additional overheads, such as a need for additional bits. Those skilled in the art will realize that the error detection accuracy using the methods in the present invention may vary depending on the strength of the constituent codes used in the BPC. However, since no additional bit allocation is necessary and the computation of the syndromes is fairly simple, especially for the SPC code and the hamming code, the present invention may be applied in a plurality of scenarios requiring decoding of an encoded digital signal stream.

The various embodiments of the present invention provide a method for analyzing a decoded digital signal stream to detect errors in the decoded digital signal stream. The present invention facilitates an increase in an accuracy of detecting errors in the decoded digital signal stream without incurring additional overheads, such as a need for additional bits. By using existing error correction codes implemented in an existing protocol, the present invention tries to detect possible errored blocks of data. This can substantially improve detection of bit errors or block errors. Those skilled in the art will realize that the error detection accuracy using the methods in the present invention may vary depending on the strength of the constituent codes used in the BPC. When combined with a fairly weak checksum or Cyclic redundancy Check (CRC) on the information bits it can provide quite adequate error detection. However, since no additional bit allocation is necessary and the computation of the syndromes is fairly simple, especially for the SPC code and the hamming code, the present invention may be applied in a plurality of scenarios requiring decoding of an encoded digital signal stream.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method of error detection in a digital signal stream comprising:

decoding an encoded digital signal stream to obtain a decoded digital signal stream, wherein the encoded digital signal stream is encoded using an N dimension block product code comprising a set of constituent codes arranged in an N-dimensional structure, wherein N is an integer greater than one;

terminating the decoding operation in a first dimension;

analyzing the decoded digital stream by calculating one or more syndromes in a second dimension not comprising the first dimension of the decoded digital signal stream; and detecting at least one invalid syndrome from the one or more calculated syndromes.

2. The method of claim 1 further comprising reporting an error in the decoded digital stream based upon detecting at least one invalid syndrome.

3. The method of claim 1, wherein the encoded digital signal stream comprises at least one information bit and at least one parity bit.

4. The method of claim 1 further comprising calculating one or more syndromes in the N dimension of the decoded digital signal stream.

5. The method of claim 1, wherein the calculating step comprises calculating the one or more syndromes in at least a N−1 dimension, the decoding operation being performed in the N dimension in response to decoding in the N−1 dimension.

6. The method of claim 1, wherein the invalid syndrome indicates one or more bit errors.

7. The method of claim 6, wherein the invalid syndrome has a non-zero value.

8. The method of claim 1 further comprising reporting no error based upon detecting a valid syndrome.

9. The method of claim 8, wherein the valid syndrome has a zero value.

10. A method of error detection in a digital signal stream comprising:
  decoding an encoded digital signal stream to obtain a decoded digital signal stream, wherein the encoded digital signal stream was encoded using at least a first constituent code and a second constituent code of a 2-dimension block product code;
  terminating the decoding operation in a second dimension;
  analyzing the decoded digital stream by calculating one or more syndromes in at least a first dimension of the decoded digital signal stream;
  detecting at least one invalid syndrome from the one or more calculated syndromes; and
  reporting an error in the decoded digital stream based upon the detected at least one invalid syndrome,
  wherein the first dimension corresponds to the first constituent code and the second dimension corresponds to the second constituent code.

11. The method of claim 10, wherein the decoding operation is further performed in the first dimension in response to decoding in the second dimension.

12. The method of claim 10, wherein at least one of the first constituent code and the second constituent code is a block code.

13. The method of claim 10, wherein at least one of the first constituent code and the second constituent code is a simple parity check (SPC) code, a hamming code, an extended hamming code, a Bose-Chaudhari-Hocquenghem (BCH) code, or an extended BCH code.

14. The method of claim 10 further comprising calculating one or more syndromes in the second dimension of the decoded digital signal stream.

15. The method of claim 10 wherein the encoded digital signal stream comprises information bits and parity bits.

16. The method of claim 10 further comprising passing the decoded digital signal stream to a higher layer process based upon detecting a valid syndrome.

17. The method of claim 10 further comprising passing the decoded digital signal stream to a higher layer process based upon not detecting an invalid syndrome.

18. A method of error detection in a digital signal stream comprising:
  decoding an encoded digital signal stream to obtain a decoded digital signal stream, wherein the encoded digital signal stream was encoded using at least a first constituent code and a second constituent code of a 2-dimension block product code;
  terminating the decoding operation in a second dimension;
  analyzing the decoded digital stream by calculating one or more syndromes in at least a first dimension of the decoded digital signal stream;
  detecting a valid syndrome from the one or more calculated syndromes; and
  passing the decoded digital signal stream to a higher layer process based upon detecting an valid syndrome,
  wherein the first dimension corresponds to the first constituent code and the second dimension corresponds to the second constituent code.

19. The method of claim 18, wherein at least one of the first constituent code and the second constituent code is a simple parity check (SPC) code, a hamming code, an extended hamming code, a Bose-Chaudhari-Hocquenghem (BCH) code, or an extended BCH code.

20. The method of claim 1, wherein the first dimension is the N dimension.

\* \* \* \* \*